United States Patent
Nakanishi et al.

[11] Patent Number: 6,157,044
[45] Date of Patent: Dec. 5, 2000

[54] TUNNEL JUNCTION TYPE JOSEPHSON DEVICE

[75] Inventors: Hidenori Nakanishi; Saburo Tanaka; Hideo Itozaki; Shuji Yazu, all of Hyogo, Japan

[73] Assignee: Sumitomo Electric Industries, Ltd., Osaka, Japan

[21] Appl. No.: 08/029,361

[22] Filed: Mar. 10, 1993

Related U.S. Application Data

[63] Continuation of application No. 07/785,872, Nov. 1, 1991, abandoned, which is a continuation of application No. 07/502,279, Apr. 2, 1990, abandoned.

[30] Foreign Application Priority Data

Mar. 31, 1989 [JP] Japan ..................................... 1-82690

[51] Int. Cl.$^7$ ........................... H01L 29/06; H01L 39/22; H01L 39/00
[52] U.S. Cl. ................ 257/33; 257/31; 257/35; 257/661; 505/190
[58] Field of Search ................ 257/33, 31, 35, 257/661; 505/190

[56] References Cited

U.S. PATENT DOCUMENTS

| | | | |
|---|---|---|---|
| 5,087,605 | 2/1992 | Hegde et al. | 257/661 |
| 5,106,823 | 4/1992 | Creuzet et al. | 257/33 |

FOREIGN PATENT DOCUMENTS

| | | | |
|---|---|---|---|
| 0304807 | 3/1988 | European Pat. Off. | 357/5 |
| 0284489 | 9/1988 | European Pat. Off. | |
| 0342039 | 11/1989 | European Pat. Off. | |
| 0349444 | 1/1990 | European Pat. Off. | |
| 308977 | 12/1988 | Japan | 357/5 |
| 63-306676 | 12/1988 | Japan | |
| 64-12585 | 1/1989 | Japan | 257/31 |
| 35972 | 2/1989 | Japan | 357/5 |
| 64-41281 | 2/1989 | Japan | 257/31 |

OTHER PUBLICATIONS

Patent Abstracts of Japan, vol. 13, No. 186 (E–752) (3534), May 2, 1989 Japanese Application 63–11 1378 (Hitachi).
Patent Abstracts of Japan, vol. 13, No. 254 (E–772) (3602), Jun. 13, 1989 Japanese Appln. 63–151680 (Sumitomo Electric).
Japanese Patent Abstract of Japan, vol. 6, No. 95(E–110) (973), Jun. 3, 1982, Japanese Appln. 57–27079 (Nippon Denshin).
Wu et al., "High Temperature Processing of Cuprate Oxide Superconductors", *Applied Physics Letters*, vol. 52, No. 22, May 30, 1988.
Patent Abstracts of Japan, vol. 13, No. 144 (E–740) (3492), Apr. 10, 1989 Japanese Application 63–306676 (Matsushita Electric).
Yoshiara et al "Superconductivity of Screen–Printed $YBa_2Cu_3Oy$ Thick films on $Y_2BaCuO_5$ Substrates" *Jap. J. Appl. Phys.*, vol. 27(8), Aug. 1988, pp. L1492–L1494.
Koch et al. "Thin Films and SQUIDS made from $YBa_2Cu_3Oy$" *MRS Conf.* Apr. 1987 pp. 81–84.

(List continued on next page.)

*Primary Examiner*—Mahshid Saadat
*Assistant Examiner*—Alice W. Tang
*Attorney, Agent, or Firm*—Kerkam, Stowell, Kondracki & Clarke, P.C.; John C. Kerins

[57] ABSTRACT

A tunnel junction type Josephson device includes a pair of superconductor layers formed of a compound oxide superconductor material and an insulator layer formed between the pair of superconductor layers. The insulator layer is formed of a compound oxide which is composed of the same constituent elements as those of the compound oxide superconductor material of the superconductor layers but with an atomic ratio which does not present a superconductivity characteristics. In addition, the superconductor layers and the insulator layer are continuously formed while supplying oxygen.

7 Claims, 1 Drawing Sheet

OTHER PUBLICATIONS

Moriwaki et al. "Josephson Junctions Observed in $La_{1.8}Sro.2_{CuO\ 4}$ Superconducting Polycrystalline–Films" *Jap. J. Appl. Phys.* vol. 26(4) Apr. 1987 pp. L521–L522.

Tsai et al. All–Ceramics Josephson Junctions Operative up to 90°K *Jap. J. Appl. Phys.* vol. 26(5) May 1987 pp. L701–L703.

Rothschild et al "Reversible Laser Chemically Induced Phase Trans. in Thin–Film $Bg_2YCu_3O_x$ Superconductors." *Appl. Phys Lett.* 52(5) Feb. 2, 1988.

Takada et al "Tunnel Junctions using oxide superconducting pp. 404–406, thin films epitaxially grown on $SrTiO_3$" Appl. Phys Lett 53(26) Dec. 26, 1988 pp. 2608–2691.

D.N. Langenberg, et al. "The Making of Josephson Junctions", Electronics, Mar. 1, 1971 pp. 42–44.

Toshiyuki Aida, et al. "Preparation of $YBa_2Cu_3O_{7-x}$ Superconducting Thin Films by RF–Magnetion Sputtering", Journal of Applied Physics, vol. 76, No. 9, Sep. 1987, pp. L1489–L1491.

Aida, et al "Preparation of $YBa_2\ Cu_2\ O_{4-x}$ Superconducthing Thin Films by RF–Magnetron Sputtering", Journal of Applied Physics, vol. 26, No. 9, Sep. 1987, pp. L1489–L1491.

Norishi et al., "Josephson Junction Observed in $La_{0-8}\ Sra_2\ CuO_4$ Superconducting Thin Films," Japanese Journal of Applied Physics, vol. 26, No. 4, Apr. 1987, pp. L521–L523.

TUNNEL JUNCTION TYPE JOSEPHSON DEVICE

This is a Continuation of Application Ser. No. 502,279, filed Apr. 2, 1990.

BACKGROUND OF THE INVENTION

1. Field of the Invention

The present invention relates to a tunnel junction type Josephson device and a method for fabricating the same, and more specifically to a novel tunnel junction type Josephson device which utilizes an excellent property of compound oxide superconductor material and a method for fabricating the same.

2. Description of Related Art

Josephson devices have been constituted of a weak link or junction between a pair of superconductors. In order to form the weak link, some constructions have been conventionally proposed. The most typical construction is a tunnel junction type Josephson device, in which an extremely thin insulating layer is interposed between a pair of superconductors.

In tunnel junction type Josephson devices which have been actually fabricated in the prior art, a superconductor has been formed of Nb, NbN, Pb and others, and an insulator layer is formed of an oxide film formed on a surface of a Nb or Pb superconductor, or a deposited film of MgO or a—Si. However, these metal type superconductors generally have a very low critical temperature of superconductivity, and therefore, cannot effectively exhibit its superconduction characteristics unless they are cooled by using a greatly expensive liquid helium.

In 1986, on the other hand, it was discovered that a sintered compound oxide such as $(La, Ba)_2CuO_4$ and $(La, Sr)_2CuO_4$ is a superconduction material having a high critical temperature Tc. Following on this discovery, it has been found that a compound oxide having a composition expressed by $Y_1Ba_2Cu_3O_{7-x}$ presents an effective superconductivity in a temperature range not less than a liquid nitrogen temperature. The superconductor material capable of assuming the superconductivity in a temperature range not less than a liquid nitrogen temperature. The superconductor material capable of assuming the superconductivity at a high temperature as mentioned above makes it possible to use an inexpensive liquid nitrogen as a cooling agent, and therefore, an actual application of a superconduction technology has been studied. Under this circumstance, various attempts are made in order to realize a Josephson device formed of compound oxide superconductor materials.

However, it has been known that conventional Josephson devices formed as an experiment by using the above mentioned compound oxide superconductor materials did not exhibit a satisfactory characteristics even at 4.2K which is a temperature of the liquid helium.

SUMMARY OF THE INVENTION

Accordingly, it is an object of the present invention to provide a Josephson device which efficiently utilizes an excellent property of compound oxide superconductor material, by overcoming the above mentioned defect of the conventional one, and a method for fabricating the same.

According to the present invention, there is provided a tunnel junction type Josephson device including a pair of superconductor layers formed of a compound oxide superconductor material and an insulator layer sandwiched between the pair of superconductor layers, wherein the insulator layer is formed of a compound oxide which is composed of the same constituent elements as those of the compound oxide superconductor material of the superconductor layers but with an atomic ratio which does not present a superconductivity characteristics.

According to another aspect of the present invention, there is provided a method for fabricating a tunnel junction type Josephson device including a pair of superconductor layers formed of a compound oxide superconductor material and an insulator layer sandwiched between the pair of superconductor layers, wherein the insulator layer is formed of a compound oxide which is composed of the same constituent elements as those of the compound oxide superconductor material of the superconductor layers, and wherein the superconductor layers and the insulator layer are continuously formed while supplying oxygen.

The compound oxide layers of the above mentioned Josephson device can be formed by a physical deposition or a chemical deposition, both of which are well known to persons skilled in the art. In particular, a sputtering or an ion plating can be advantageously utilized.

The superconductor material used in the tunnel junction type Josephson device in accordance with the present invention can be of $YBa_2Cu_3O_{7-x}$ or a compound oxide constituted by substituting a lanthanide such as Ho and Er for Y of $YBa_2Cu_3O_{7-x}$, $Tl_2Ba_2Ca_2Cu_3O_{10-y}$ or $Bi_2Sr_2Ca_2Cu_3O_{10-y}$ or these compound oxide added with Pb.

The insulator layer can be formed of $Y_2Ba_1Cu_1O_{5-y}$ or $Y_1Ba_3Cu_2O_z$ if the superconductor layers are formed of $YBa_2Cu_3O_{7-x}$. In addition, if the superconductor layers are formed of $RBa_2Cu_3O_{7-x}$ (where R represents a lanthanide), namely, if Y or $YBa_2Cu_3O_{7-x}$ is substituted with a lanthanide such as Ho and Er, the insulator layer can be formed of $R_2BaCuO_{7-x}$.

Furthermore, a substrate on which the above mentioned Josephson device is formed is constituted of a $SrTiO_3$ single crystal or a MgO single crystal.

The thickness of the superconductor layers is on the order of 1,000Å to 3,000Å, and the thickness of the insulator layer is on the order of 20Å to 100Å, and preferably on the order of 50Å to 100Å.

As seen from the above, the tunnel junction type Josephson device in accordance with the present invention is characterized in that the insulator layer is formed of a compound oxide which is composed of the same constituent elements as those of the compound oxide superconductor material which forms the superconductor layers.

A conventional method of forming an insulator layer by a surface oxidation of a superconductor is not effective for a compound oxide superconductor material which is originally an oxide. In the prior art, therefore, it has been proposed to form between a pair of superconductor layers an insulator layer composed of another insulating material, and it has been actually attempted to form the insulator layer with MgO, $Al_2O_3$, $ZrO_2$, and others.

However, none of the conventionally fabricated Josephson devices could present a satisfactory result. According to a study of the inventors of the present invention, the causes for presenting no satisfactory result are as follows:

(1) A compound oxide superconductor material requires a heat treatment in the process of formation. At the time of the heat treatment, however, elements, which constitutes an insulator layer, will diffuse into a superconductor layer in proximity of an interface between the insulator layer and the superconductor layer. As a result, the superconductivity is lost.

(2) In environment of a high temperature and a low oxygen partial pressure, such as in a deposition apparatus used for depositing each layer of the Josephson device, oxygen contained in the compound oxide superconductor material is absorbed by an insulator layer, so that the superconductor layer deteriorates.

(3) Since the insulator and the high temperature superconductor are greatly different in lattice constant, in thermal expansion coefficient and in other factors, a distortion is generated in an interface between the insulator and the superconductor.

In the Josephson device in accordance with the present invention, the above mentioned problems will be overcome by utilizing the fact that if a compound oxide superconductor material is changed in atomic ratio of constituent elements, the material loses its superconductivity and therefore becomes an insulator.

If the insulator layer of the Josephson device is formed of a compound oxide very similar to the superconductor material, superconductor layers and an insulator layer, which constitute the Josephson device, can be continuously formed without changing a layer deposition condition. In addition, the differences in lattice constant and in thermal expansion coefficient between the superconductor layers and the insulator layer are reduced, and therefore, a deterioration of characteristics caused by the interface distortion is restrained, and the layers can easily become a epitaxial crystal. Furthermore, since the insulator layer itself is a compound oxide, the insulator layer will not absorb oxygen from the superconductor layer, and accordingly, the characteristics of the superconductor layer will not be lost.

In a preferred embodiment, the formation of the superconductor layers and the insulator layer is advantageously performed while supplying oxygen by use of an oxygen nozzle or an oxygen ion gun. With this treatment, oxidation of the layers is facilitated, and even if a heat treatment which would be performed after deposition of the layers were omitted, a superconductor layer having an excellent characteristics can be obtained.

The above and other objects, features and advantages of the present invention will be apparent from the following description of a preferred embodiment of the invention with reference to the accompanying drawings. However, it should be noted that the following disclosure is merely one embodiment for making it easier to understand the present invention, and the present invention is in no way limited to the details of the illustrated structures.

DESCRIPTION OF THE PREFERRED EMBODIMENT

Figure 1:
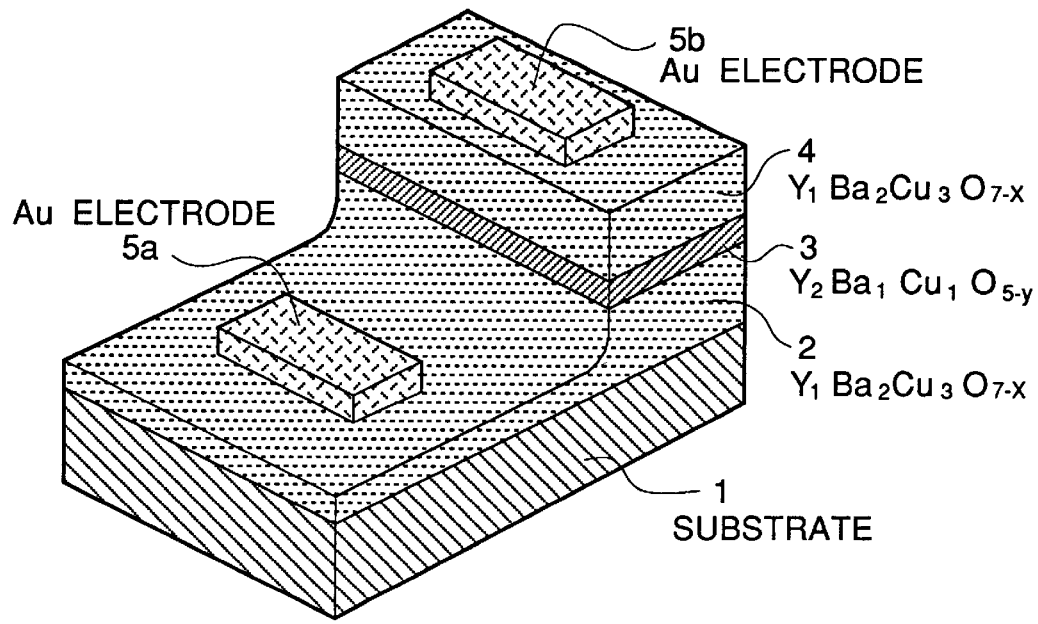
FIG. 1 is a diagrammatically perspective view of an embodiment of the tunnel junction type Josephson device in accordance with the present invention.

Referring to FIG. 1, there is shown a diagrammatically perspective view of an embodiment of the tunnel junction type Josephson device in accordance with the present invention.

As shown in FIG. 1, the Josephson device is formed of a first superconductor layer 2, an insulator layer 3 and a second superconductor layer 4 stacked in the named order on a substrate 1. The insulator layer 3 and the superconductor layer 4 are partially cut out so as to expose a portion of the superconductor layer 2, and a pair of electrodes 5a and 5b are formed on the exposed portion of the superconductor layer 2 and the remaining superconductor layer 4.

Each of the superconductor layers 2 and 4 is formed of $YBa_2Cu_3O_{7-x}$, and has a thickness on the order of 1,000Å to 3,000Å. On the other hand, the insulator layer 3 is formed of $Y_2Ba_1Cu_1O_{5-y}$ and has a thickness on the order of 50Å to 100Å. Thus, the superconductor layer 2, the insulator layer 3 and the superconductor layer 4 form a SIS Josephson junction structure.

The Josephson device as mentioned above can be fabricated in the following manner.

The first superconductor layer 2 is deposited on a (001) plane of a $SrTiO_3$ single crystal substrate by a RF sputtering. A Target used is one composed of powdered carbonate of each of Y and Ba and powdered oxide of Cu mixed with a proportion which allows a deposited layer to have a composition of $YBa_2Cu_3O_{7-y}$. The sputtering is carried under the following conditions: a substrate temperature of 600° C., a deposition rate of 5Å/sec and a high-frequency power of 600W. This sputtering is continuously performed until the superconductor layer 2 is deposited to have a thickness of 1,000Å to 3,000Å. In addition, in the process of sputtering, oxygen and oxygen ions are blown onto the substrate by means of an oxygen nozzle and an oxygen ion gun so that oxidation of the deposited layer is facilitated.

The layer of $YBa_2Cu_3O_{7-y}$ thus formed was analyzed by an X-ray diffraction method. Only diffraction peaks of (00m) inherent to the (001) orientation were observed. This means that it was confirmed that the formed layer is a crystal film having an orientation of (001).

After the deposition of the superconductor layer 2 having the thickness of 1,000Å to 3,000Å, the insulator layer 3 is deposited. The deposition conduction for the insulator 3 is the same as that for the superconductor layer 2, but a target used is one composed of powdered carbonate of each of Y and Ba and powdered oxide of Cu mixed with a modified proportion which causes a deposited layer to have a composition of $Y_2Ba_1Cu_1O_{5-y}$. Thus, the insulator layer 3 of $Y_2Ba_1Cu_1O_{5-y}$ having a thickness of 50Å to 100Å is formed on the superconductor layer 2 of $YBa_2Cu_3O_{7-y}$. In this process of sputtering for the insulator layer 3, oxygen and oxygen ions are also blown onto the substrate by means of the oxygen nozzle and the oxygen ion gun so that oxidation of the deposited layer is facilitated.

On the insulator layer thus formed, the second superconductor layer 4 is deposited to have a thickness of 1,000Å to 3,000Å. In this process of formation of the second superconductor layer 4, the target which enables to form a deposited layer having a composition $YBa_2Cu_3O_{7-y}$ is used again, and the sputtering is performed under the same condition, while similarly supplying oxygen.

Thus, the tunnel type Josephson junction can be formed in a continuous process without breaking a vacuum condition of a sputtering apparatus, by previously setting within the sputtering apparatus a target which enables to form a deposited layer having a composition of $YBa_2Cu_3O_{7-y}$ and another target which enables to form a deposited layer having a composition of $Y_2Ba_1Cu_1O_{5-y}$ and by selectively using one of the two targets.

The layered structure thus formed, which is composed of the superconductor layers and the insulator layer to form a SIS tunnel junction, is selectively dry-etched until the lower superconductor layer is partially exposed, and thereafter, Au is evaporated on each of the two superconductor layers so as to form an electrode on an upper surface of each of an exposed position of the lower superconductor layer 2 and the remaining upper superconductor layer 4. Thus, the tunnel junction type Josephson device as shown in FIG. 1 is obtained.

Figure 2:
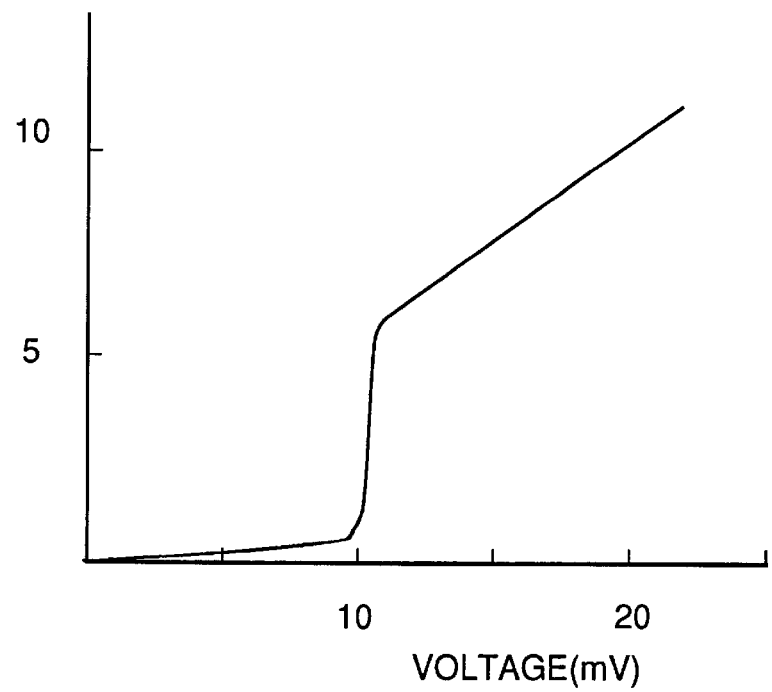
FIG. 2 is a graph illustrating a voltage/current characteristics of the tunnel junction type Josephson device fabricated in accordance with the present invention.

Referring to FIG. 2, there is shown a graph illustrating a measured voltage/current characteristics of the tunnel junction type Josephson device in accordance with the present invention fabricated in the process as mentioned above. The measurement was made at a temperature of 4.2K.

It is observed from FIG. 2 that an electric current flowing through the tunnel junction type Josephson device abruptly drops in the neighborhood of 11mV corresponding to an energy gap. Namely, it is confirmed that an excellent tunnel Josephson junction is formed.

As mentioned above, the Josephson device in accordance with the present invention is such that the insulator layer is formed of a compound oxide which is composed of the same constituent elements as those of the compound oxide superconductor material. Therefore, an excellent junction is formed at an interface between each superconductor layer and the insulator layer.

In the process of fabrication, since the insulator layer itself is composed of a compound oxide, the insulator layer will not absorb oxygen from the compound oxide superconductor layers, and therefore, the quality of the superconductor layer is not deteriorated.

Thus, the Josephson device in accordance with the present invention is constituted of a compound oxide superconductor material having a high critical temperature, and accordingly, makes it possible to economically utilize the Josephson devices.

The invention has thus been shown and described with reference to the specific embodiment. However, it should be noted that the present invention is in no way limited to the details of the illustrated structures but changes and modifications may be made within the scope of the appended claims.

What is claimed is:

1. A stacked SIS tunnel junction type Josephson device including a pair of superconductor layers formed of a Y—Ba—Cu—O type compound oxide superconductor material and an insulator layer sandwiched between the pair of superconductor layers so as to form a three-layer laminated structure, wherein said pair of superconductor layers comprises a lower superconductor layer and an upper superconductor layer, said upper superconductor layer being deposited on said insulator layer, wherein said insulator layer is formed of a Y—Ba—Cu—O type compound oxide which is composed of the same constituent elements as those of the compound oxide superconductor material of said superconductor layers but with an atomic ratio of $Y_2Ba_1Cu_1O_{5-y}$ which is an insulator at least at the operating temperature of the SIS tunnel junction type Josephson device and wherein said upper superconductor layer is an epitaxial layer formed on said insulator layer.

2. A tunnel junction type Josephson device claimed in claim 1 wherein each of said pair of superconductor layers is formed on $YBa_2Cu_3O_{7-x}$.

3. A stacked SIS tunnel junction type Josephson device including a pair of superconductor layers formed of a Y—Ba—Cu—O type compound oxide superconductor material and an insulator layer sandwiched between the pair of superconductor layers so as to form a three-layer laminated structure, wherein said pair of superconductor layers comprises a lower superconductor layer and an upper superconductor layer, said upper superconductor layer being deposited on said insulator layer wherein said insulator layer is formed of a Y—Ba—Cu—O type compound oxide which is composed of the same constituent elements as those of the compound oxide superconductor material of said superconductor layers but with an atomic ratio of Y:Ba:Cu=2:1:1 which is an insulator at least at the operating temperature of the SIS tunnel junction type Josephson device, wherein each of said pair of superconductor layers is formed of $YBa_2Cu_3O_{7-x}$ and said insulator layer is formed of $Y_2Ba_1Cu_1O_{5-y}$, and wherein said upper superconductor layer is an epitaxial layer formed on said insulator layer, and wherein said insulator layer has a thickness of 20Å to 100Å.

4. A tunnel junction type Josephson device claimed in claim 3 wherein each of said pair of superconductor layers has a thickness of 1,000Å to 3,000Å.

5. A tunnel junction type Josephson device claimed in claim 4 wherein one of said pair of superconductor layers is formed on an $SrTiO_3$ single crystal substrate or a MgO single crystal substrate.

6. A tunnel junction type Josephson device claimed in claim 4, wherein one of said pair of superconductor layers is formed on an MgO single crystal substrate.

7. A stacked SIS tunnel junction type Josephson device including a pair of superconductor layers formed of a Y—Ba—Cu—O type compound oxide superconductor material and an insulator layer sandwiched between the pair of superconductor layers so as to form a three-layer laminated structure, wherein said pair of superconductor layers comprises a lower superconductor layer and an upper superconductor layer, said upper superconductor layer being deposited on said insulator layer wherein said insulator layer is formed of a Y—Ba—Cu—O type compound oxide which is composed of the same constituent elements as those of the compound oxide superconductor material of said superconductor layers but with an atomic ratio of $Y_2Ba_1Cu_1O_{5-y}$ which is an insulator at least at the operating temperature of the SIS tunnel junction type Josephson device, an wherein each of said pair of superconductor layers has an electrode of Au formed on an upper surface of an exposed portion of each of said pair of superconductor layers, and wherein said upper superconductor layer is an epitaxial layer formed on said insulator layer.

* * * * *

UNITED STATES PATENT AND TRADEMARK OFFICE
CERTIFICATE OF CORRECTION

PATENT NO. : 6,157,044  
DATED : December 5, 2000  
INVENTOR(S) : Nakanishi et al.

Page 1 of 1

It is certified that error appears in the above-identified patent and that said Letters Patent is hereby corrected as shown below:

<u>Column 6,</u>
Line 3, "on" should be -- of --

<u>Column 6,</u>
Lines 32-33, "or a MgO single crystal substrate" is to be deleted.

Signed and Sealed this

Fifth Day of March, 2002

*Attest:*

JAMES E. ROGAN
*Attesting Officer*  *Director of the United States Patent and Trademark Office*